United States Patent [19]

Boivin

[11] Patent Number: 4,579,083
[45] Date of Patent: Apr. 1, 1986

[54] AUTOMATIC VARIABLE RATE EVAPORATION SOURCE FOR THIN FILM DEPOSITION

[75] Inventor: Germain Boivin, Ste Foy, Canada

[73] Assignee: Canadian Patents and Development Limited, Ottawa, Canada

[21] Appl. No.: 725,331

[22] Filed: Apr. 19, 1985

Related U.S. Application Data

[63] Continuation-in-part of Ser. No. 569,233, Jan. 21, 1984, abandoned.

[51] Int. Cl.$^4$ ............................................. C23C 14/54
[52] U.S. Cl. ..................... 118/664; 118/720; 118/726; 118/712
[58] Field of Search ............... 118/664, 720, 721, 726, 118/504, 688, 665, 712; 427/10

[56] References Cited

U.S. PATENT DOCUMENTS 3,117,024  1/1964  Ross ................................... 118/712
3,502,051  3/1970  Adams ............................... 118/720
4,207,836  6/1980  Nonaka ............................. 118/664
4,425,871  1/1984  Martin ............................... 118/664

FOREIGN PATENT DOCUMENTS 48-17153  5/1973  Japan ................................. 118/712

*Primary Examiner*—Bernard F. Plantz

[57] ABSTRACT

An apparatus for automatically controlling the rate of vacuum deposition of thin films on a substrate, consisting of an optical diaphragm or shutter in the form of two overlapping plates which together define a shutter opening between an evaporation crucible and a substrate. The overlapping plates are attached to a pair of rack gears to be moved in opposite directions by a pinion gear to vary the size of the shutter opening through which the evaporated material must pass to be deposited on the substrate. The rate of evaporation is sensed by a quartz crystal monitor and a signal therefrom is compared to a reference signal. The difference between the two signals is used to control the movement of the apertured plates thereby correcting the rate of deposition of the thin film.

Figure 4:
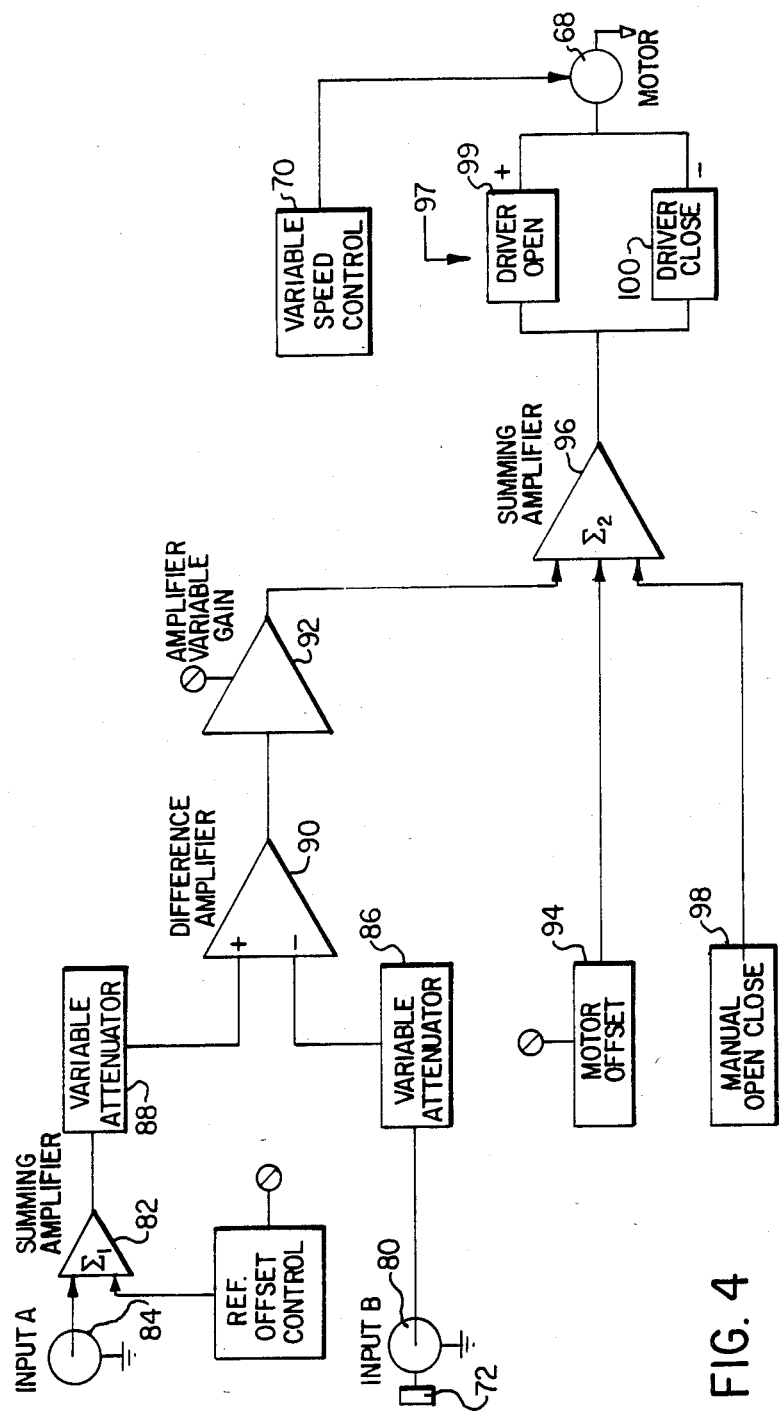

1 Claim, 4 Drawing Figures 4,579,083

AUTOMATIC VARIABLE RATE EVAPORATION SOURCE FOR THIN FILM DEPOSITION

This application is a continuation-in-part of application Ser. No. 569,233, filed Jan. 21, 1984, and now abandoned.

This invention relates to vacuum deposition of thin films and, more particularly, to an apparatus for automatically controlling the rate of deposition of vacuum deposited thin films, such as optical interference coatings.

The optical interference coatings produced by vacuum deposition of thin films are required to have reproducible indices of refraction and thickness. Super-position of a number of homogeneous films of known refractivity and thickness is also desirable.

There is also an interest in inhomogeneous coatings, that is, films whose index of refraction varies continuously inside the film. One way to achieve this result is the socalled co-evaporation technique.

Semiconductor technology also requires precise control of dopant material for reproductible fabrication of semiconductor devices. The doping may be homogeneous or modulated such as superlattices. In any case, deposition rate needs precise control.

Prior attempts to provide a coating, such as the devices disclosed in U.S. Pat. No. 3,248,256 and U.S. Pat. No. 3,799,800, are not entirely satisfactory due to the lack of means for automatically controlling the rate of deposition of the film or the unnecessary complexity of the automatic controls provided.

Other prior attempts include controlling the rate of evaporation by varying the supply of power to the crucibles. However, due to thermal inertia in the crucibles, control of the evaporation rate is not satisfactory.

Another attempt to produce composite film is based on the so-called beam chopping technique which requires highly stabilized temperature of the evaporation source.

It has also been proposed in U.S. Pat. No. 4,207,836, to control the deposited amount of material that is vacuum deposited on substrates, which are rotated at a speed of 100 rpm around a turntable to pass over evaporating boats, by controlling the power to the boats and by adjusting the aperture opening defined by externally operable shutters which are rotatably mounted to be driven coaxially with the turntable. This proposal adjusts the aperture opening by moving the shutters along an arcuate path and so can only adjust the rate of deposition by opening the shutters in the direction of the arcuate path and can not adjust the opening transversely or radially to that path.

There is a need for an apparatus for automatically controlling thin film deposition by means of a shutter device which opens and closes symmetrically about a longitudinal axis.

According to the present invention there is provided an apparatus for automatically controlling the rate of deposition of thin films on a substrate placed above an evaporation crucible; said apparatus comprising a pair of superimposed, slideable shutter plates which between them define a rectangular aperture, said rectangular aperture being dimensioned and arranged to provide a rate of deposition controlling, rectangular shutter opening between said crucible and said thin film, so that with said shutter plates in one position said shutter opening is fully open; a pair of rack gears with facing teeth, the rack gears being slidable along parallel paths and having the shutter plates secured thereto with the longitudinal axis of the rectangular aperture defined therebetween at an angle to the said parallel paths so that the rectangular aperture will open and close symmetrically about said longitudinal axis and an axis normal thereto; a pinion between, and meshing with, the facing teeth; and drive means connected to said pinion to move both of said plates to open or close said shutter opening; control means for activating said driving means, said control means comprising: means for sensing, and generating a signal in relation to, the rate of evaporation; means for generating a reference signal; means for comparing differences between the signals from said sensing means and said reference signal and for actuating said drive means in response to changes in the rate of deposition.

Figure 2:
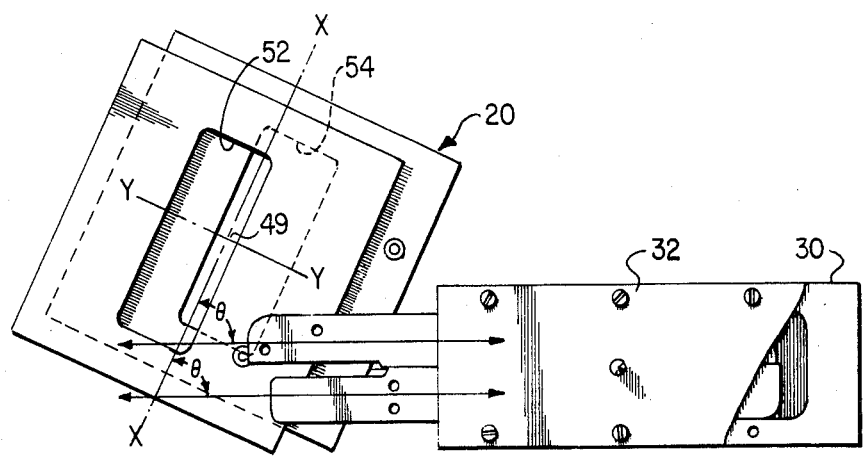
Figure 1:
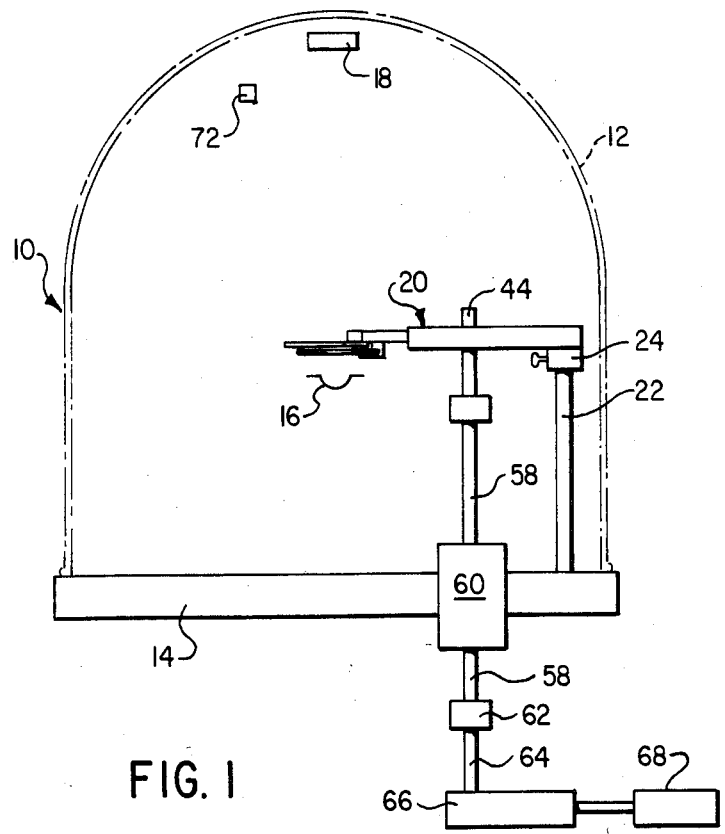
Figure 3:
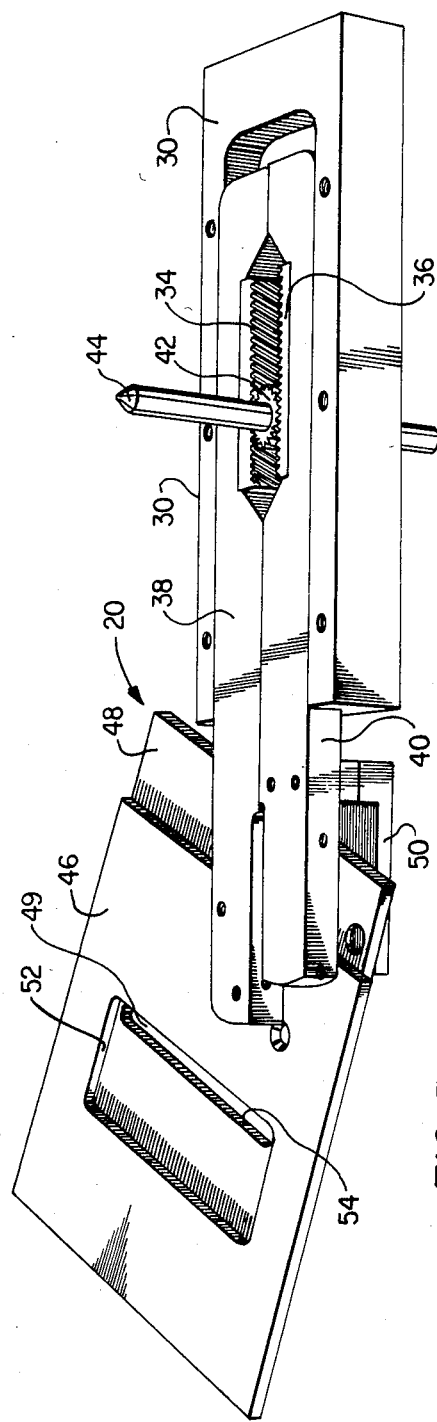

In the accompanying drawings, which illustrate, by way of example, an embodiment of the present invention, FIG. 1 is a diagrammatic side view of an apparatus for vacuum deposition of thin film on a substrate, and includes a shutter and drive means for automatically controlling the rate of deposition of the thin film, FIG. 2 is a plan view of the shutter, FIG. 3 is a perspective view of the shutter of FIG. 2 and with the cover plate removed, and FIG. 4 is a schematic illustration of the electronic circuit for automatically controlling the drive means.

Referring now in detail to the drawings, an apparatus for vacuum deposition of thin films, which is shown generally at 10 in FIG. 1, includes a gas tight enclosure 12 having a base 14 which is evacuated by a suitable high vacuum pump (not shown).

A crucible 16, containing material to be evaporated, is positioned within the enclosure 12 and provided with an electrical energy supply in a known manner so that its resistive heater element (not shown) will provide the suitable temperature required for the evaporation of the evaporant material.

A substrate 18 of suitable material such as glass, on which the evaporant material is to be deposited, is suspended above the crucible 16 in a conventional manner. Interposed between the crucible 16 and the substrate 18 and in axial alignment therewith is an optical diaphragm or shutter assembly, indicated generally at 20 in FIGS. 1, 2 and 3. The shutter assembly 20 is adjustably secured to one end of a vertical rod 22 by an annular clamp 24. The other end of the rod 22 is secured to the base 14.

As shown more clearly in FIGS. 2 and 3, the shutter assembly 20 includes a housing or gear box 30 having a cover plate 32 adapted to receive a pair of rack gears 34 and 36 with the teeth of the rack gears facing each other. The rack gears 34 and 36 are secured to slidable members 38 and 40 respectively to slide along parallel paths. The teeth of the rack gears 35 and 36 mesh with a pinion gear 42 therebetween carried by a shaft 44. The slidable member 38 is secured in any conventional manner to an upper one of a pair of superimposed, rectangularly apertured plates 46 and 48 with a longitudinal axis XX (FIG. 2) of a rectangular shutter opening or slit 49 defined therebetween tilted at an angle $\alpha$ to the parallel paths along which the members 38 and 40 are slidable so that the rectangular aperture 49 will open and close symmetrically about the longitudinal axis XX. The lower plate 48 is similarly secured to a bracket 50, which is in turn secured to the slidable member 40. The bracket 50 spaces the lower plate from the slidable member 40 so that the upper face of the plate 48 will be immediately below the under surface of the plate 46.

Apertures 52 and 54, in the plates 46 and 48 respectively, are so dimensioned and arranged that flow of evaporated material from the crucible 16 will be substantially unimpeded through the rectangular shutter opening or slit 49 when the apertures 52 and 54 are aligned. Rotation of the pinion 42 causes the symmetrical opening or closing of the shutter opening or slit about axis XX (FIG. 2) and an axis YY normal thereto by outward movement of one of the slidable members 38 or 40 and inward movement of the other slidable member 38 or 40, depending on the direction of rotation of the pinion 42 and the other components of the power train, including the drive motor described herebelow.

With reference to FIG. 1, the shaft 44 has its lower end coupled to a shaft 58 extending from a rotary vacuum feed through device 60. The feed through device 60 preferably has an O-ring (not shown) surrounding the shaft 58 to prevent loss of vacuum within the enclosure 12 and is sealed to the base 14 through which it extends. The shaft 58 extends from the lower end of the device 60 to a shaft 64 extending from a speed reducer 66. The clutch 62 is preferably a nylon bushing which will disconnect the speed reducer 66 from the shaft 58 in the event that the shutter mechanism 20 should jam.

The speed reducer 66 is in turn connected to the output shaft of a suitable electric motor 68, in this case a type NSH-12 dc reversible motor manufactured by the Bodine Electric Co. As shown diagrammatically in FIG. 4, the motor 68 is controlled by a variable speed control 70. A suitable type of motor speed control is a model SH12FB speed control manufactured by the Minarik Electric Co.

The block diagram in FIG. 4 shows a suitable circuit for energizing the motor 68 in response to changes in the rate of deposition of the evaporated substance monitored by a quartz crystal 72 disposed in the same vertical plane as that containing the longitudinal axis XX (FIG. 2) of the rate controlling shutter 20 and passing through an axis perpendicular to and at the centre of the face to be cooled of the substrate 18.

In this circuit, the input to 80 receives a signal from the quartz monitor 72. A summing amplifier 82 shifts the level of a reference input 84 by adding a dc offset voltage to this function. Two variable attenuators 86 and 88 control the levels of the signals from inputs 80 and 84 respectively. A difference amplifier 90 provides a signal equal to the difference between the output signals from 86 and 88 and this difference is amplified by a variable gain amplifier 92.

A motor offset 94 provides an appropriate dc voltage which is added to the differential signal from the variable gain amplifier 92 to compensate for possible hysteresis of the motor 68. The signal from the amplifier 92 and the motor offset 94 are combined in a summing amplifier 96. A manually operated control 98 is also provided. The manual control 98 supplies plus or minus 14 volts to the summing amplifier 96 to open or close the shutter 20 without changing the calibration of the input 80 and 84 signal or the manual signal plus or minus 14 volts can thus be supplied to a switching circuit shown generally at 97 of the drivers 99 and 100 according to the correction desired. The drivers 99 and 100 in turn deliver variable power (maximum approximately 40 watts) to the motor 68.

Assuming the electrical circuit is connected to a suitable supply of electrical power, including a relatively constant supply to heat the crucible 16, and that the required vacuum is provided within the enclosure 12 the apparatus is calibrated to provide the desired condensation rate on the substrate 18.

When two or more such systems control the evaporation rate of two or more materials of different physical properties according to pre-set reference functions fed into the appropriate inputs A of each system, a film of variable composition is obtained in the direction perpendicular to the substrate.

From the foregoing description of the elements, operation of the apparatus will be obvious to a skilled operator familiar with such feedback type controls. Briefly, the shutter opening of the shutter 20 is symmetrically adjusted to provide the desired rate of deposition as monitored by the quartz crystal monitor 72. As long as no difference is detected between signals from inputs 80 and 84 at the difference amplifier 90, the drivers 99 and 100 will not be energized to adjust the opening of the shutter 20. On the other hand, should a difference be detected by the difference amplified, the drivers will operate to make the necessary correction.

Briefly, the opening of the shutter is adjusted to provide the maximum rate of deposition necessary for the projected experiments. Assuming both signals from inputs 84 and 80 are conveniently calibrated, the shutter opening is then closed symmetrically to a position corresponding to the preset starting value of the evaporation rate. After the evaporation starts, no correction will be made, until a difference is detected at the difference amplifier 90; should a difference be detected by the difference amplifier, the drives 99 or 100 will operate to make the necessary correction. In other words, the role of the system consists in tracking the desired reference function supplied to input 84. In the general case, this reference function is variable in time.

The calibration of the system consists in the determination of the proportionality constant, k, in the equation $R = kV$, where R is the rate of growth of the layer on the substrate A/sec, and V is the output signal from the ratemeter in volts. A suitable method of calibration consists in evaporating a layer of thickness, d, in a time, t, at rate R. As d can be measured by conventional technique and t is known, so is R. Since V is known, k can be determined. This calibration is valid for a particular temperature of the substrate and is nearly independent of the pressure in the vacuum system when the quartz crystal monitor 72 and the substrate are approximately equidistant from the source of evaporation. However, if the sticking coefficient of a material is affected by the presence of another co-evaporation material, chemical analysis of the film composition would be preferable.

The shutters and the mechanism of the Applicant's invention has the advantage that the axes XX, YY (FIG. 2) of the rectangular shutter opening remain fixed as the shutter opening 49 is opened or closed, or, put another way, the shutter opening 49 remains symmetrical. Opening and closing the shutter opening 49 symmetrically in this manner has the advantage of better deposition control because the portions of the deposition vapour source in crucible 16 (FIG. 1) seen by the substrate 18 and the monitor 72 are always identical. It is well known to persons skilled in the art that evaporation sources are not homogenous when, for example, the deposition material sublimates. Thus better deposition control is attained if the substrate 18 and the monitor 72 always see the same portion of the deposition vapour source in crucible 16.

I claim:

1. An apparatus for automatically controlling the rate of deposition of thin films on a substrate placed above an evaporation crucible, said apparatus comprising: a pair of superimposed, slidable shutter plates which between them define a rectangular aperture, said rectangular aperture being dimensioned and arranged to form a rectangular shutter opening between said crucible and said thin film so that with said shutter plates in one position said shutter opening is fully open; a pair of rack gears with facing teeth, the rack gears being slidable along parallel paths and having the shutter plates secured thereto with the longitudinal axis of the rectangular aperture defined therebetween, said longitudinal axis is tilted at an angle to the said parallel paths so that the rectangular shutter opening will open and close symmetrically about said longitudinal axis and an axis normal thereto; a pinion between, and meshing with, the facing teeth; drive means connected to said pinion to move both of said plates to open or close said shutter opening; and control means for activating said driving means, said control means comprising: means for sensing and generating a signal in relation to the rate of evaporation; means for generating a reference signal; and means for comparing differences between the signals from said sensing means and said reference signal and for actuating said drive means in response to changes in the rate of deposition.

* * * * *